United States Patent
Till et al.

(10) Patent No.: US 12,078,033 B2
(45) Date of Patent: Sep. 3, 2024

(54) DOWNHOLE TOOL

(71) Applicant: Nemein Limited, Bridgend (GB)

(72) Inventors: Lawrence Till, South Wales (GB); Suzannah Bourne, South Wales (GB)

(73) Assignee: Nemein Limited, Bridgend (GB)

(*) Notice: Subject to any disclaimer, the term of this patent is extended or adjusted under 35 U.S.C. 154(b) by 0 days.

(21) Appl. No.: 17/623,180

(22) PCT Filed: Jun. 23, 2020

(86) PCT No.: PCT/EP2020/067454
§ 371 (c)(1),
(2) Date: Dec. 27, 2021

(87) PCT Pub. No.: WO2020/260254
PCT Pub. Date: Dec. 30, 2020

(65) Prior Publication Data
US 2022/0356788 A1    Nov. 10, 2022

(30) Foreign Application Priority Data
Jun. 24, 2019 (GB) .................... 1909016

(51) Int. Cl.
*E21B 41/00* (2006.01)
*H10N 10/17* (2023.01)

(52) U.S. Cl.
CPC ......... *E21B 41/0085* (2013.01); *H10N 10/17* (2023.02)

(58) Field of Classification Search
CPC ..... E21B 41/0085; H10N 10/17; H10N 10/00
See application file for complete search history.

(56) References Cited

U.S. PATENT DOCUMENTS

| | | |
|---|---|---|
| 6,134,892 A | 10/2000 | Turner |
| 2005/0061362 A1 | 3/2005 | Graham |
| 2006/0213669 A1 | 9/2006 | Shipley |
| 2007/0151591 A1* | 7/2007 | Jeffryes ............... E21B 41/0085 166/57 |
| 2008/0033653 A1* | 2/2008 | Pabon ..................... G01V 1/44 702/6 |
| 2015/0027735 A1 | 1/2015 | Murphree |
| 2015/0107824 A1* | 4/2015 | Signorelli ............. H01G 11/62 166/244.1 |
| 2017/0107795 A1* | 4/2017 | Yeo ..................... E21B 41/0085 |
| 2018/0202288 A1* | 7/2018 | Elbadawy ............... E21B 47/14 |
| 2018/0313192 A1* | 11/2018 | Frosell .................. H10N 10/13 |

FOREIGN PATENT DOCUMENTS

| | | |
|---|---|---|
| EP | 2500511 | 9/2012 |
| FR | 2747238 | 4/1996 |
| WO | 2015075426 | 5/2015 |
| WO | 2018125093 | 7/2018 |

* cited by examiner

*Primary Examiner* — Brad Harcourt
(74) *Attorney, Agent, or Firm* — Skinner and Associates; Joel Skinner

(57) ABSTRACT

A downhole tool is described comprising a housing (24), a fluid flow passage (28) located within (5) the housing (24), and at least one thermoelectric generator (30) located between the fluid flow passage (28) and the housing (24) and operable to generate an electrical output in the event of there being a temperature difference between, in use, the fluid within the fluid flow passage (28), and fluid in contact with the exterior of the housing (24).

12 Claims, 1 Drawing Sheet

DOWNHOLE TOOL

This invention relates to a downhole tool for use in the oil and gas extraction industries.

When a borehole is being drilled, for subsequent use in oil or gas extraction, it is well known to use a bottom hole assembly including a rotatable drill bit supported at a lower end of drill string to drill, and thereby extend, the borehole. Various sensors are provided to provide information to operators regarding the location and orientation of the bottom hole assembly, the outputs of the sensors being used in, for example, controlling the operation of systems that permit control over the direction in which the borehole is extended, and hence over the path followed by the borehole. By appropriate control over the path followed by the borehole, the operator may be able to ensure that the borehole passes through a number of regions from which oil and gas can subsequently be extracted.

It is usual, during the drilling process, for a drilling fluid (sometimes referred to as mud) to be supplied through the drill string to the bottom hole assembly, where the drilling fluid is used to cool and clean the cutters of the drill bit. In cooling the drill bit, the drilling fluid temperature rises. At any point at which the bottom hole assembly bears against the formation, heating of the bottom hole assembly will occur, and the drilling fluid flow serves to cool the bottom hole assembly and so rises in temperature as a result of such contact. The drilling fluid then passes upwards along the borehole towards the surface, carrying the formation material removed by the drill bit in extending the borehole with it. The temperature at which the drilling fluid is supplied to the drill string is usually considerably lower than the temperature of the returning fluid, this difference arising from a number of factors including having served to cool parts of the drilling system and from the earth formation materials through which the borehole extends. Drilling fluid pressure losses will also give rise to temperature variations. Consequently, these hydraulic temperature effects and frictional effects cause the drilling fluid returning to the surface to be at a higher temperature than the drilling fluid flowing through the drill string towards the bottom hole assembly during normal operating conditions.

As mentioned above, the bottom hole assembly typically includes a number of sensors and actuators, and there is a need to provide a power supply to allow these components to operate. Whilst batteries or other electrical storage means may be used, as the bottom hole assembly may be in use downhole for an extended period of time, the use of batteries to provide electrical power is not desired. Alternative power supply regimes include using the drilling fluid to drive a turbine that, in turn, can be used to generate electricity. However, such a system has the disadvantage that power ceases when the supply of drilling fluid in the manner described hereinbefore is interrupted. Such interruptions may arise, for example, if the drilling fluid supply pumps are switched off as may occur when additional lengths of drill pipe are being connected to the drill string.

It is an object of the invention to provide a downhole tool which can generate electricity and so may serve as an electrical supply to other components. It is another object of the invention to provide a downhole tool which can serve as a sensor providing information indicative of a number of parameters to an operator.

According to the present invention there is provided a downhole tool comprising a housing, a fluid flow passage located within the housing and through which fluid can flow, in use, in a direction predominantly from the surface, and at least one thermoelectric generator located between the fluid flow passage and the housing and operable to generate an electrical output in the event of there being or having been a temperature difference between, in use, the fluid within the fluid flow passage, and fluid in contact with the exterior of the housing which can flow, in use, in a direction predominantly towards the surface.

As described hereinbefore, in normal use the drilling fluid supplied towards a bottom hole assembly is at a considerably lower temperature than the drilling fluid returning through the borehole towards the surface, although in some drilling environments such as in polar or other very cold environments, this may not always be the case. By using the fluid flow passage as part of the passage through which drilling fluid is supplied towards the bottom hole assembly, and by allowing returning drilling fluid to flow or wash over the exterior of the housing, it will be appreciated that an electrical output may be generated by the thermoelectric generator from this temperature difference. This temperature difference normally remains for a period of time after the flow of drilling fluid is interrupted due to geothermal gradients heating the fluid in the wellbore annulus. Consequently, electrical power may continue to be generated during at least some periods of time which drilling fluid is not being actively supplied to the bottom hole assembly.

Whilst normally, the fluid flow through the fluid flow passage will be away from the surface, and the fluid flow within the wellbore annulus will be towards the surface, there can be circumstances in which fluid ceases to flow, or at which the fluid flow directions differ from this norm. By way of example, drill string movement during the connection process can result in short term, temporary reverses in flow direction, unless valves are provided to prevent this. Also, gains in annulus pressure which halt return flow, losses in the annulus which interrupt flow to the surface, or some swab/surge issues in tripping can cause these effects. Also, occasionally, reverse fluid circulation may be deliberately achieved.

Preferably, a plurality of thermoelectric generators are provided. The thermoelectric generators may substantially surround the fluid flow passage.

Thermoelectric generators are typically relatively fragile. As downhole tools are used in an environment in which equipment is typically subject to significant levels of vibrations and/or in which tools can be subject to sudden impacts with, for example, the formation being drilled, preferably a resilient shock absorbing mounting is provided for the or each thermoelectric generator. As the shocks to which the downhole tools are subject can result in additional heating of, for example, the housing of the tool, the thermoelectric generator(s) may further generate electrical outputs as a results of such impacts and/or vibrations. The resilient shock absorbing mount is preferably of metallic form, providing a thermally conductive path between the thermoelectric generator(s) and the fluid flow passage or the housing. The design of the or each mount is preferably such that the thermoelectric generators are compressed between the mount(s) and the housing to ensure good thermal contact therewith. The mount(s) thus preferably takes the form of a preloaded spring or the like.

The electrical outputs generated by the thermoelectric generator(s) may be used to power other downhole equipment, and/or to charge electrical power stores or the like.

Alternatively, or additionally, as the output of each thermoelectric generator is related to the temperature difference to which that thermoelectric generator is exposed, the electrical outputs generated by the thermoelectric generators may be used to form an output indicative of the temperature to which the parts of the housing in the vicinity of the thermoelectric generators are exposed. The electrical outputs may be used to form a thermal image, with the downhole tool serving as a thermal camera. However, the output of the downhole tool may be displayed in other ways, for example non-graphically as a list of temperatures or a list of electrical outputs.

It will be appreciated that if the downhole tool is located in a part of the drill string or bottom hole assembly that is temporarily not rotating, and mud or the like is building up around the downhole tool, then the parts of the tool around which mud has accumulated may be at a different temperature to those over which drill fluid is still flowing. The thermoelectric generators located adjacent certain parts of the housing will thus produce a different output to those located adjacent other parts of the housing, providing an indication of how much of the tool has become submerged within the accumulated mud. By monitoring the output of the tool, the fact that the tool has stopped rotating, and the level to which it is submerged within the mud can be ascertained, and appropriate remedial action taken. It will be appreciated, therefore, that the tool can identify conditions leading to a stuck pipe or the like.

This represents just one application in which the invention can be employed. In another, by monitoring the outputs of the thermoelectric generators as drilling progresses, and hence as the tool is moving axially along the borehole, it can be noted if temporary temperature increases occur around the entirety of the housing of the tool. As these temperature increases may be caused by the housing of the tool rubbing against the wall of the borehole, causing frictional heating of the housing, appropriate monitoring of the output can be used to provide information relating to, for example, the shape and dimensions of the borehole.

Another application in which the tool can be used is in detecting the occurrence of, for example, influxes of fluid or fluid losses into the formation which would lead to a detectable change in temperature along a part of the borehole.

It will be appreciated that the tool of the invention may be employed in a number of applications, providing information that may be of assistance to an operator and indicative of, for example, influxes, kick or blowouts, mud loss, differential sticking, swab and surge effects, hole cleaning performance, cutting bed build up, ECD and ESD data, downhole temperature, drill string washouts, lateral shocks and vibrations, key seating, micro doglegs and forward and reverse whirl. These represent just some of the types of information or conditions that may be sensed using the tool, and the tool may be used in detecting the occurrence of other circumstances or other information.

The invention will further be described, by way of example, with reference to the accompanying drawings, in which.

Figure 1:
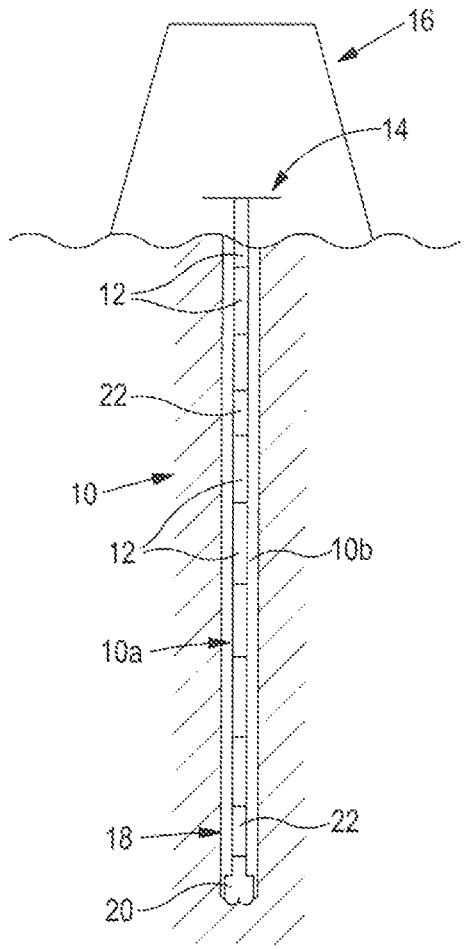
FIG. 1 is a diagrammatic view illustrating part of a drill string incorporating a downhole tool in accordance with an embodiment of the invention.
Figure 2A:
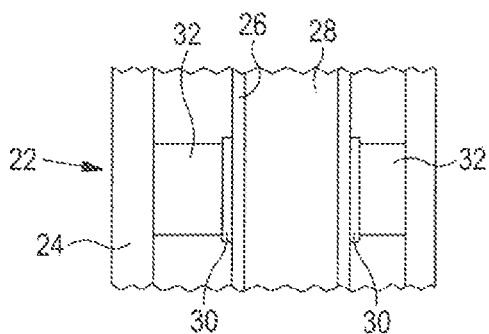
FIGS. 2a and 2b are diagrammatic views illustrating part of the downhole tool of FIG. 1.
Figure 2B:
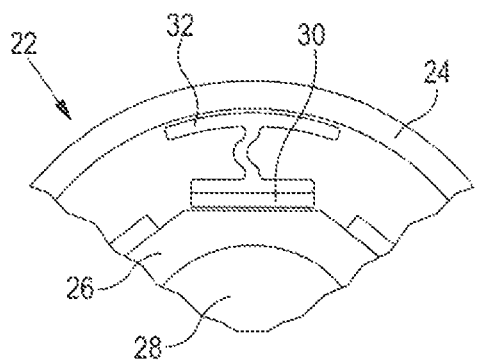

Referring firstly to FIG. 1, a drill string 10 for use in the formation of a borehole 10a for subsequent use in the extraction of oil or gas is illustrated, in use. The drill string 10 comprises a series of tubulars 12 connected to one another in an end to end configuration, with the uppermost tubular 12 connected, at its upper end, to a rotary top drive 14 of a drilling rig 16 operable to drive the drill string 10 for rotation and to apply a weight-on-bit load thereto. To the lower end of the lowermost one of the tubulars 12 is secured a bottom hole assembly 18 including a drill bit 20 that is operable, upon rotation thereof whilst a weight on bit loading is applied, to gouge, scrape or abrade material from the bottom of the borehole, thereby increasing the length of the borehole 10a. An annulus 10b or annular passage is formed between the drill string 10 and the wall of the borehole 10a.

The rig 16 is arranged to supply drilling fluid under pressure to the interior of the tubulars 12, the fluid being conveyed within the tubulars 12 to the bottom hole assembly 18 from where it is delivered through openings or nozzles formed in the drill bit 20 to cool and clean parts of the drill bit 20 and other parts of the system, and to carry material removed by the drill bit 20 upwardly along the borehole, along the annulus between the wall of the borehole and the exterior of the tubulars 12, towards the surface.

It will be appreciated that this is a very much simplified description of a borehole drilling installation and that, in use, the drill string 10 and bottom hole assembly 18 may include a number of other components which may serve, for example, to aid guiding of drilling and/or to provide information to an operator to assist him in controlling the drilling operation.

In accordance with the invention, located within the drill string and/or within the bottom hole assembly, is a downhole tool 22. FIG. 1 illustrates the presence of a tool 22 part way along the length of the drill string 10, and another tool 22 within the bottom hole assembly 18, but it will be appreciated that the invention is not restricted in this regard. A single such tool 22 may be provided, for example in one or other of these locations, or a greater number of tools 22 may be provided, if desired.

The tool 22 comprising an outer housing 24 of generally cylindrical form. The housing 24 is shaped, at its ends, for cooperation with other pieces of downhole equipment, for example for connection to tubulars 12 or the like. By way of example, conventional pin or box couplings may be formed at the ends of the housing 24.

Within the housing 24, and substantially concentric therewith, is a tubular member 26 defining a fluid flow passage 28 through which drilling fluid may be conducted, in use, between an inlet end of the housing 24 and an outlet end thereof, so that drilling fluid being conveyed along the drilling string 10 towards the drill bit 20, for example, may be conducted through the fluid flow passage 28.

The tubular member 26 is of smaller diameter than the housing 24 and an annular void 28 is defined therebetween.

The tool 22 further comprises a plurality of thermoelectric generator modules 30. The generator modules 30 are located within the void 28, and each of the modules 30 is arranged such that a 'hot side' thereof faces towards the part of the housing 24 adjacent thereto, and the 'cool side' thereof faces towards the part of the tubular member 26 adjacent thereto. Several such modules 30 are provided, the modules 30 substantially encircling the tubular member 26. By way of example, six, seven or eight such modules 30 may be provided. It will be appreciated, however, that a greater number, or fewer, of such modules 30 may be provided, for example depending upon the dimensions of the tool and the required resolution of the tool. Furthermore, although only a single set of modules surrounding or encircling the tubular member 26 are provided, if desired two or more sets of modules could be provided at intervals along the length of the tubular member 26 to provide additional information, in use.

The precise nature of the modules 30 is not of relevance to the invention, save to say that in the event of there being a difference between the temperatures to which the 'hot side' and the 'cool side' are exposed, the modules 30 generate an electrical output. Thermoelectric generator modules are well known, as are the manner in which they function, and so no detailed description thereof is included herein.

Each module 30 is carried by a respective generally resilient mount 32, preferably of a material of a good thermal conductivity. By way of example, the mount 32 is conveniently of a metallic material. The mount 32 is preferably secured to the inner face of the housing 24, conducting heat from the housing 24 to the 'hot side' of the module 30 whilst supporting the module 30 such that the 'cool side' thereof is closely adjacent and compressed against the tubular member 26. The tubular member 26 may be shaped such that the exterior thereof is of substantially polygonal form, so that the modules 30 can lie flat against the outer surface thereof. The mounts 32 are preferably in the form of resilient springs or the like, applying a load to the modules 30 to compress the modules 30 against the tubular member 26 to achieve a good thermal contact therewith. By way of example, the mounts 32 may be arranged such that the pressure forcing the modules 30 against the tubular member 32 is in excess of 100 psi. Preferably, the mounts 32 incorporate an elastomeric material element located between parts thereof, urging the said parts apart and damping relative movement of the said parts. The elastomeric material may provide an additional thermal conduction path between the said parts. The shapes of the mounts 32 are such that they can resiliently deform or flex in the event that the tool 22 is subject to an external shock or vibration, reducing the transmission of the shock or vibration to the modules 30 and so reducing the risk of damage thereto and extending the working life of the modules 30 and hence of the tool 22. As such deformation or flexing will result in heating of the mounts 32, it will be appreciated that the modules 30 can produce an electrical output as a result of the occurrence of such shocks or vibrations.

In part as a result of the nature of the mounts 32, the thermal resistance in the radial direction of the tool is considerably lower than that in the axial or circumferential direction. Consequently, the output of each module 30 is directly related to the temperature to which the adjacent part of the housing 24 is exposed. The output of each module 30 responds rapidly to changes in the temperature to which the adjacent part of the housing 24 is exposed. By way of example, the response time may be less than 50 ms, and may be around 20 ms.

As the tubular member 26 may be of smaller diameter than the passages formed within the tubulars 12, for example, the parts of the tubular member 26 located close to the ends of the tool 22 may be of tapering diameter so as to smooth the flow of drilling fluid, avoiding the formation of regions of significant, undesirable turbulent flow therein.

In use, with the tool 22 installed within a drill string 10 or bottom hole assembly 18, drilling fluid is supplied through the drilling string 10 to and through the tubular member 26, and subsequently through the bottom hole assembly 18 and drill bit 20 to the borehole being drilled. As described hereinbefore, the drilling fluid supplied in this manner is relatively cool, and so serves to reduce the temperature of the 'cool sides' of the modules 30. The drilling fluid exiting the nozzles or the like of the drill bit 20 enters the annulus 10*b* between the drill string 10 and the surface of the borehole, flowing along this annulus 10*b* towards the surface. The action of drilling and other factors results in the drilling fluid being of elevated temperature. The formation material surrounding the borehole and in which the borehole is being formed may further raise the temperature of the fluid, as may certain vibration and shock events experienced by the drill string 10. As the drilling fluid washes over the housing 24, it will be appreciated that the temperature of the housing 24 will rise, increasing the temperature of the 'hot sides' of the modules 30. The difference in temperature between the 'cool sides' and 'hot sides' of the modules 30 results in each module 30 generating an electrical output.

When operated as described above, it will be appreciated that the drilling fluid flowing through the tool flows predominantly in a direction away from the surface, and the fluid flow in the annulus is predominantly in a direction towards the surface. Whilst normally, the fluid flow through the fluid flow passage will be away from the surface, and the fluid flow within the wellbore annulus will be towards the surface, there can be circumstances in which fluid ceases to flow, or at which the fluid flow directions differ from this norm. By way of example, drill string movement during the connection process can result in short term, temporary reverses in flow direction, unless valves are provided to prevent this. Also, gains in annulus pressure which halt return flow, losses in the annulus which interrupt flow to the surface, or some swab/surge issues in tripping can cause these effects. Also, occasionally, reverse fluid circulation may be deliberately achieved.

The outputs from the modules 30 may be used to supply electrical power to other downhole equipment, if desired.

Figure 3:
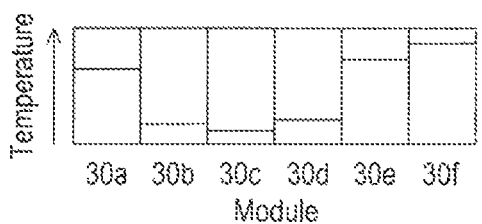
FIG. 3 is a diagrammatic representation illustrating an output of the tool of FIG. 2.

Alternatively, or additionally, as shown in FIG. 3 the outputs of the modules 30 may be analysed independently of one another to provide information relating to the temperatures to which the parts of the housing 24 adjacent each of the modules 30 is exposed. By way of example, as mentioned hereinbefore, if the downhole tool is located in a part of the drill string 12 or bottom hole assembly 18 that is temporarily not rotating, and a mud cake or the like is building up around the downhole tool, then the parts of the tool around which mud has accumulated may be at a different temperature to those over which drill fluid is still flowing. The modules 30*b*, 30*c*, 30*d* located adjacent certain parts of the housing 24 will thus produce a different output to the modules 30*a*, 30*e*, 30*f* located adjacent other parts of the housing 24, providing an indication of how much of the tool has become submerged within the accumulated mud. By monitoring the output of the tool, the fact that the tool has stopped rotating, indicative of a stuck pipe condition occurring, and the level to which it is submerged within the mud can be ascertained, and appropriate remedial action taken.

In another application, by monitoring the outputs of the thermoelectric generators as drilling progresses, and hence as the tool is moving axially along the borehole, it can be noted if temporary temperature increases occur around the entirety of the housing 24 of the tool. As these temperature increases may be caused by the housing 24 of the tool rubbing against the wall of the borehole, causing frictional heating of the housing 24, appropriate monitoring of the output can be used to provide information relating to, for example, the shape and dimensions of the borehole. Similarly, the tool can be used to detect the occurrence of influxes or loss of fluid to the formation that result in temperature changes of the fluid within the annulus 10*b*.

It will be appreciated that the tool of the invention may be employed in a number of applications, providing information that may be of assistance to an operator and indicative of, for example, influxes, kick or blowouts, mud loss, differential sticking, swab and surge effects, hole cleaning performance, cutting bed build up, ECD and ESD data, downhole temperature, drill string washouts, lateral shocks and vibrations, key seating, micro doglegs and forward and reverse whirl. These represent just some of the types of information or conditions that may be sensed using the tool, and the tool may be used in detecting the occurrence of other circumstances or other information. As the same tool can be used to monitor all of these situations or conditions, it will be appreciated that by appropriate analysis of the outputs from the modules 30, the occurrence of a wide range of conditions can be sensed and, if appropriate, remedial action taken. Potentially, the invention allows significant levels of expense to be saved by detecting issues at an early stage at which they can still be remedied, before conditions become critical.

In one convenient arrangement, the outputs of the modules 30 may be displayed graphically, for example in the form of a heat or temperature chart indicating the temperatures at or around the periphery of the housing 24. A skilled or appropriately trained or experienced operator may be able to interpret such a chart to identify the occurrence of certain issues. Alternatively, by appropriate computer processing of the output data, the occurrence of certain events may be detected in an automated fashion.

Although described hereinbefore in relation to drilling applications in which the tool is rotating, in normal use, it will be appreciated that the rotation need not be continuous, and may be interrupted, for example for the purposes of steering or for adding extra lengths of drill pipe to the drill string. Furthermore, the invention could be employed in applications in which no rotation or significant rotation occurs, for example in applications in which primarily sliding movement of the tool occurs.

Whilst a specific embodiment of the invention is described hereinbefore, it will be appreciated that a wide range of modifications and alterations may be made thereto without departing from the scope of the invention as defined by the appended claims.

The invention claimed is:

1. A downhole tool comprising a housing, a fluid flow passage provided by a tubular member located within the housing and through which fluid can flow, in use, in a direction predominantly from the surface, there being a void between the tubular member and the housing and a plurality of thermoelectric generator modules located in the void between the fluid flow passage and the housing, substantially surrounding the fluid flow passage and operable to generate an electrical output in the event of there being or having been a temperature difference between, in use, the fluid within the fluid flow passage, and fluid in contact with the exterior of the housing which can flow, in use, in a direction predominantly towards the surface, wherein a resilient shock absorbing mount is provided for the thermoelectric generator modules, and wherein the resilient shock absorbing mounts are preloaded to apply a compressive load to the plurality of thermoelectric generator modules, such that a pressure forcing the thermoelectric generator modules against the tubular member is in excess of 100 psi, thereby to compress the thermoelectric generator modules against the housing for thermal contact between the tubular member and the housing.

2. A tool according to claim 1, wherein at least one of the resilient shock absorbing mount is of a material of high thermal conductivity.

3. A tool according to claim 1, wherein at least one of the resilient shock absorbing mount is of metallic form, providing a thermally conductive path between the at least one thermoelectric generator modules and the fluid flow passage or the housing.

4. A tool according to claim 3, wherein the resilient shock absorbing mount provides a thermally conductive path between the thermoelectric generator modules and the housing.

5. A tool according to claim 1, wherein the housing is adapted to be rotated in normal use.

6. A tool according to claim 1, wherein the electrical output generated by the thermoelectric generator modules is used to power downhole equipment.

7. A tool according to claim 1, wherein the electrical output generated by the at least one thermoelectric generator is used to charge electrical power stores.

8. A tool according to claim 7, wherein the electrical output is used to form a thermal image, with the downhole tool serving as a thermal camera.

9. A tool according to claim 7 and adapted to provide information indicative of the occurrence of at least one of influxes, kick or blowouts, mud loss, differential sticking, swab effects, surge effects, hole cleaning performance, cutting bed build up, ECD and ESD data, downhole temperature, drill string washouts, lateral shocks and vibrations, key seating, micro doglegs, forward whirl and reverse whirl.

10. A tool according to claim 1, wherein the electrical output generated by the thermoelectric generators modules is used to form an output indicative of the temperature to which the parts of the housing in the vicinity of the thermoelectric generator modules are exposed.

11. A tool according to claim 1, wherein an exterior of the tubular member has a shape of polygonal form.

12. A tool according to claim 1, wherein an exterior of the tubular member comprises a flat shape against which the thermoelectric generator modules is compressed.

* * * * *